United States Patent
Yamaki

(10) Patent No.: US 8,629,454 B2
(45) Date of Patent: Jan. 14, 2014

(54) SEMICONDUCTOR DEVICE

(75) Inventor: Fumikazu Yamaki, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 51 days.

(21) Appl. No.: 13/487,761

(22) Filed: Jun. 4, 2012

(65) Prior Publication Data

US 2012/0305936 A1    Dec. 6, 2012

(30) Foreign Application Priority Data

Jun. 2, 2011 (JP) ................. 2011-124288

(51) Int. Cl.
*H01L 29/20* (2006.01)
*H01L 29/778* (2006.01)

(52) U.S. Cl.
USPC ...... 257/76; 257/192; 257/194; 257/E29.089; 257/E29.246; 438/172

(58) Field of Classification Search
USPC ............ 257/76, 192, 194, E29.089, E29.246; 438/172, FOR. 179
See application file for complete search history.

(56) References Cited

U.S. PATENT DOCUMENTS 7,250,643 B2 * 7/2007 Nishi ........................... 257/194
2003/0183886 A1 10/2003 Inoue et al.

FOREIGN PATENT DOCUMENTS

JP    2003-297854 A    10/2003

* cited by examiner

*Primary Examiner* — Thanh V Pham
(74) *Attorney, Agent, or Firm* — Westerman, Hattori, Daniels & Adrian, LLP

(57) ABSTRACT

A semiconductor device includes: a nitride semiconductor layer; a source electrode, a gate electrode and a drain electrode; an insulating layer covering at least the gate electrode and a part of the nitride semiconductor layer; and a field plate on the insulating layer, a width of a region of the field plate between an edge of the field plate of a side of the drain electrode and an edge of the side face of the insulating layer covering a side face of the gate electrode of a side of the drain electrode being 0.1 μm or more, a distance between an edge of the field plate and an edge of the drain electrode in a contact face between the nitride semiconductor layer and the drain electrode being 3.5 μm or more, an operating frequency of the semiconductor device being 4 GHz or less.

13 Claims, 4 Drawing Sheets

US 8,629,454 B2

SEMICONDUCTOR DEVICE

CROSS-REFERENCE TO RELATED APPLICATION

This application is based upon and claims the benefit of priority of the prior Japanese Patent Application No. 2011-124288, filed on Jun. 2, 2011, the entire contents of which are incorporated herein by reference.

BACKGROUND (i) Technical Field

The present invention relates to a semiconductor device.

(ii) Related Art

Japanese Patent Application Publication No. 2003-297854 discloses that a field plate is provided on an insulating layer between a gate electrode and a drain electrode in a FET (Field Effective Transistor) used for an amplifier circuit operating with high voltage.

SUMMARY

It is an object to provide a semiconductor device achieving reduction of a source-drain capacitance and suppression of current collapse.

According to an aspect of the present invention, there is provided a semiconductor device including: a substrate; a nitride semiconductor layer that is provided on the substrate and includes a channel layer and an electron supply layer; a source electrode, a gate electrode and a drain electrode provided on the nitride semiconductor layer; an insulating layer that covers at least a side face and a top face of the gate electrode and a surface of a part of the nitride semiconductor layer between the gate electrode and the drain electrode; and a field plate that is located between the gate electrode and the drain electrode on the insulating layer, a width of a region of the field plate between an edge of the field plate of a side of the drain electrode and an edge of the side face of the insulating layer covering a side face of the gate electrode of a side of the drain electrode being 0.1 µm or more, a first distance between an edge of the field plate of the side of the drain electrode and an edge of the drain electrode of the side of the gate electrode in a contact face between the nitride semiconductor layer and the drain electrode being 3.5 µm or more, an operating frequency of the semiconductor device being 4 GHz or less.

DETAILED DESCRIPTION

A field plate may cause increasing of a source-drain capacitance Cds that is a capacitance between a source and a drain. When the capacitance Cds is increased, a drain efficiency of a FET may be degraded. In particular, in a case of high frequency operating, the drain efficiency may be greatly degraded. On the other hand, current collapse may be increased when the field plate is not provided.

Comparative Example

Figure 1A:
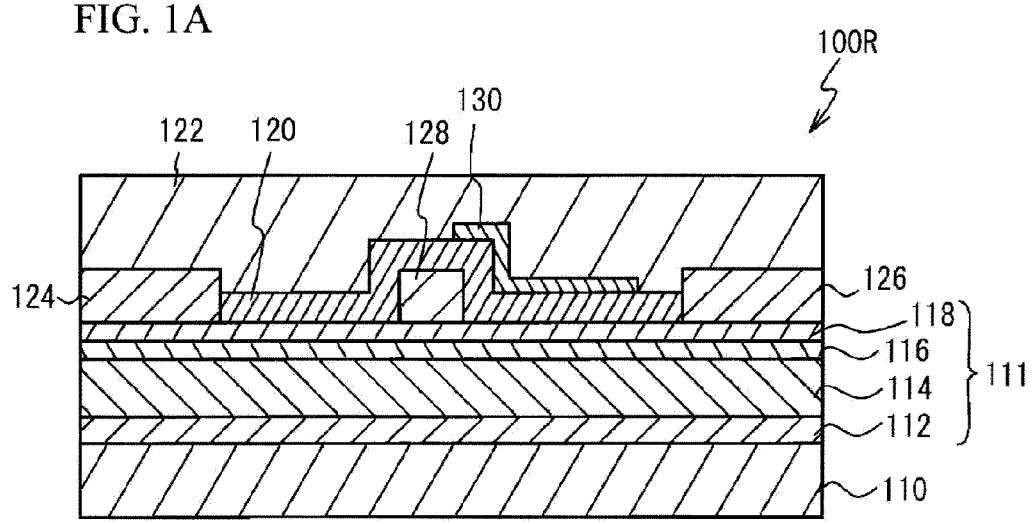
FIG. 1A illustrates a cross sectional view of a FET in accordance with a comparative example.

A description will be given of a comparative example. FIG. 1A illustrates a cross sectional view of a FET in accordance with the comparative example. In the following description, a FET may be a HEMT.

As illustrated in FIG. 1A, a FET 100R has a substrate 110, a nitride semiconductor layer 111, insulating layers 120 and 122, a source electrode 124, a drain electrode 126, a gate electrode 128, and a field plate 130.

The nitride semiconductor layer 111 is provided on the substrate 110. The nitride semiconductor layer 111 has a barrier layer 112, a channel layer 114, an electron supply layer 116 and a cap layer 118. The barrier layer 112, the channel layer 114, the electron supply layer 116 and the cap layer 118 are laminated in this order from the substrate 110 side. Two-dimensional electron gas (2DEG) is generated in an interface between the channel layer 114 and the electron supply layer 116.

The source electrode 124, the drain electrode 126 and the gate electrode 128 are provided on the cap layer 118 and are in contact with the cap layer 118. Above the cap layer 118, the insulating layer 120 covers the gate electrode 128. The field plate 130 is provided on the insulating layer 120 between the gate electrode 128 and the drain electrode 126. A part of the field plate 130 is on the gate electrode 128. The insulating layer 122 is provided on the insulating layer 120, the source electrode 124, the drain electrode 126 and the field plate 130. The source electrode 124 and the field plate 130 are electrically coupled to each other. And, the field plate 130 has the same electrical potential as the source electrode 124. A capacitance between the source electrode 124 and the drain electrode 126 (source-drain capacitance) includes a capacitance between the field plate 130 and the drain electrode 126.

Figure 1B:
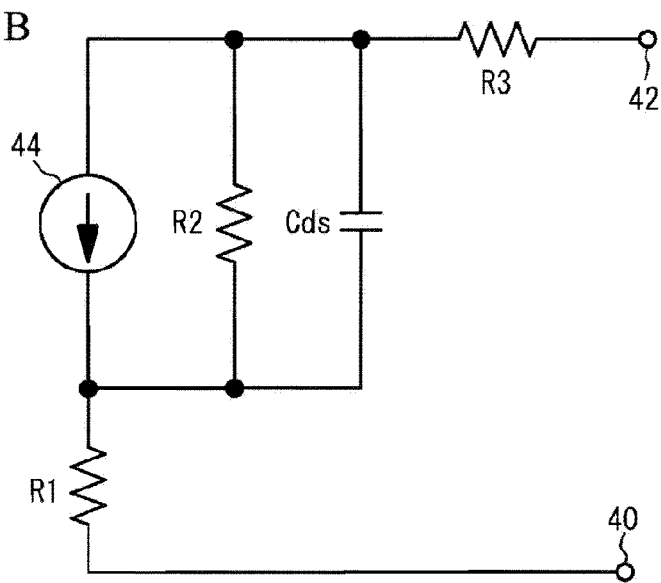
FIG. 1B illustrates an equivalent circuit on the side of an output of the FET.

The field plate 130 mitigates electrical field and reduces a feedback capacitance Cdg. However, an efficiency of a FET may be reduced in a high frequency operating. A description will be given of the reduction of the efficiency. FIG. 1B illustrates an equivalent circuit on the side of an output of the FET.

As illustrated in FIG. 1B, when the output side of the FET is illustrated with an equivalent circuit, a main unit of the FET has a structure in which a current source 44, a resistor R2 having a channel resistance, and a capacitor having a source-drain capacitance Cds are coupled in parallel. A drain side of the FET is coupled to a drain terminal 42 via a resistor R3 having a resistance on the side of the drain. The source side of the FET is coupled to a source terminal 40 via a resistor R1 having a resistance on the side of the source.

The capacitance Cds corresponds to a capacitance between a source and a drain (source-drain capacitance). Impedance of the capacitance Cds is expressed as "$1/j\omega Cds$" with use of an angular frequency "$\omega$". Therefore, when an operating frequency is increased, the impedance of the capacitance Cds is reduced. This results in reduction of the efficiency of the FET. In particular, in communication standards covering a mobile phone of 3.9th-generation (LTE: Long Term Evolution) and a mobile phone of fourth-generation, the operating frequency of the FET is increased to 2.6 GHz to 4 GHz. In the high frequency operating, the efficiency of the FET may be reduced greatly. The present inventor has found that reduction of the capacitance Cds is needed, compared to another FET operating in 2 GHz band. The following embodiments have an object of reducing the capacitance Cds and increasing the efficiency of the FET in the FET operating in a high frequency band of 2.6 GHz to 4 GHz.

There is a case where a FET is used as an amplifier circuit covering an envelope tracking system. It is necessary for an envelope-tracking amplifier to achieve 65% output or more, because another system is capable of achieving efficiency less than 65% in calculation. In order to achieve the efficiency of 65% or more in the envelope-tracking system, it is necessary for a FET acting as an amplifier element of the envelope-tracking system to achieve the drain efficiency of 70% or more.

Figure 2:
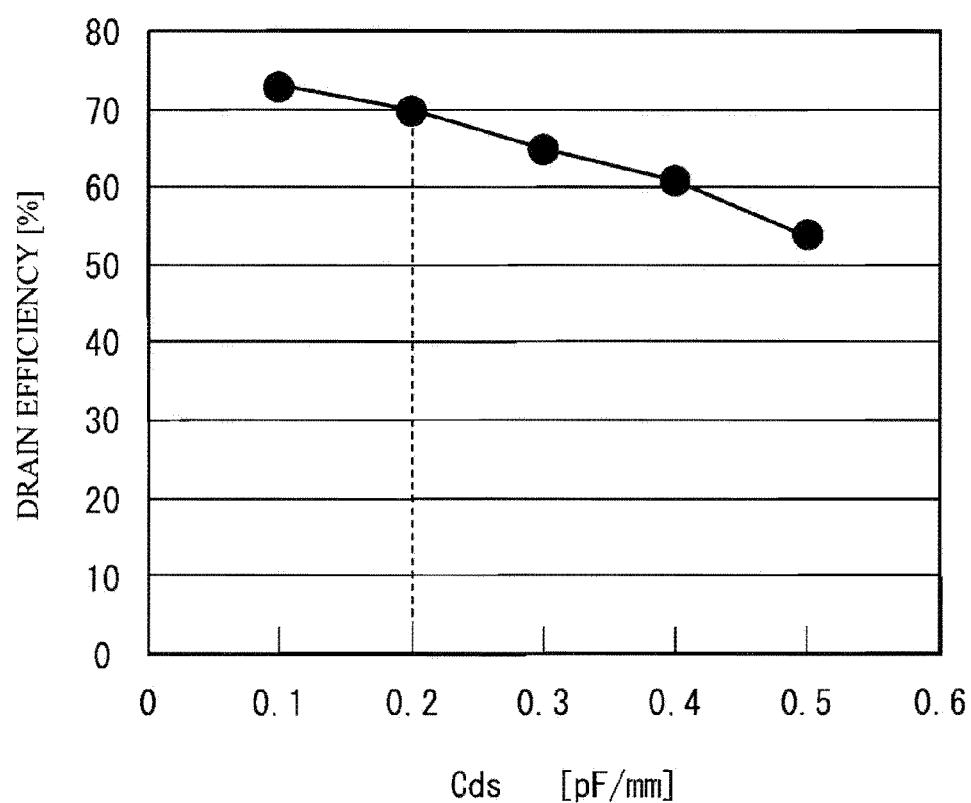
FIG. 2 illustrates a relationship between a capacitance Cds and a drain efficiency.

A description will be given of a relationship between the capacitance and the efficiency. FIG. 2 illustrates a relationship between the capacitance Cds and the drain efficiency. A horizontal axis indicates the capacitance Cds. A vertical axis indicates the drain efficiency.

As illustrated in FIG. 2, the drain efficiency is increased as the capacitance Cds is reduced. FIG. 2 illustrates the drain efficiency at 4 GHz. Vds is 50 V, and Vgs is −1.5 V as a measuring condition. As indicated by a dotted line, the capacitance Cds is 0.2 pF/mm or less in order to achieve efficiency of 70% or more, at the operating frequency of 4 GHz or less.

A field plate is provided for a purpose of reducing current collapse. At an operating frequency less than 2 GHz, the efficiency is more than 70% in spite of a designing of the capacitance Cds with use of a field plate. For the reasons, an influence of the field plate on the capacitance Cds has not been taken account of.

A description will be given of embodiments.

[First Embodiment]

Figure 3:
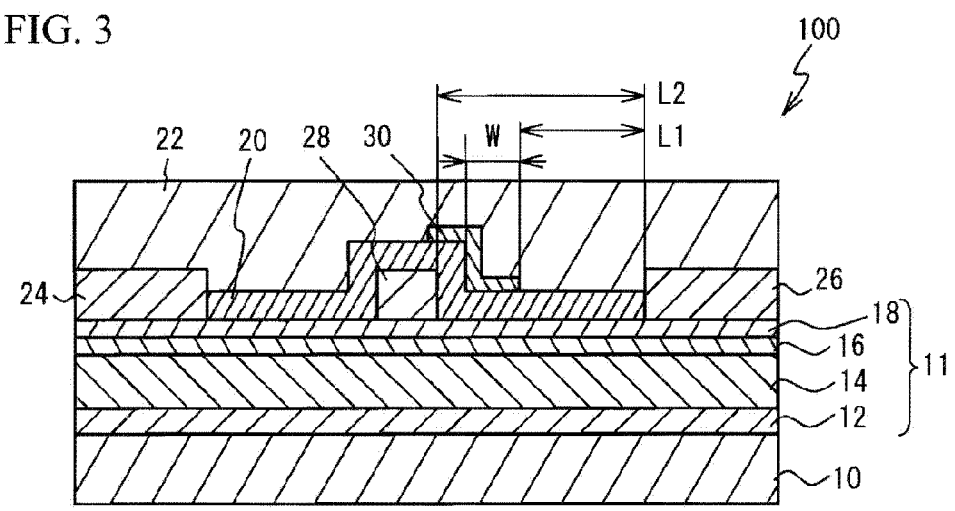
FIG. 3 illustrates a FET in accordance with a first embodiment.

FIG. 3 illustrates a FET in accordance with a first embodiment. An explanation of the same structure as FIG. 1A is omitted.

As illustrated in FIG. 3, a FET 100 (a semiconductor device) in accordance with the first embodiment has a substrate 10, a nitride semiconductor layer 11, insulating layers 20 and 22, a source electrode 24, a drain electrode 26, a gate electrode 28 and a field plate 30. An operating frequency of the FET 100 is, for example, 2.6 GHz or more.

The substrate 10 is composed of silicon carbide (SiC) or the like. A barrier layer 12 is composed of aluminum nitride (AlN) or the like. A channel layer 14 is composed of gallium nitride (GaN) or the like. An electron supply layer 16 is composed of aluminum gallium nitride (AlGaN) or the like. A cap layer 18 is composed of GaN or the like. The insulating layers 20 and 22 are composed of an insulator such as silicon nitride (SiN) or the like. The source electrode 24 and the drain electrode 26 are an ohmic electrode having a metal lamination structure in which titanium and aluminum are laminated in this order from below (Ti/Al) or tantalum and aluminum are laminated in this order from below (Ta/Al). A wiring composed of gold (Au) or the like is provided on the source electrode 24 and the drain electrode 26. The gate electrode 28 has a metal lamination structure in which nickel and gold are laminated in this order from below (Ni/Au).

A thickness of the barrier layer 12 is, for example, 50 nm. A thickness of the channel layer 14 is, for example, 1000 nm. A thickness of the electron supply layer 16 is, for example, 20 nm. A thickness of the cap layer 18 is, for example, 5 nm. A thickness of the insulating layer 20 is, for example, 450 nm. A thickness of the insulating layer 22 is, for example, 600 nm. A thickness of the field plate 30 is, for example, 200 nm to 300 nm. A thickness direction is a vertical direction (up and down) in FIG. 3. A width direction is a horizontal direction of FIG. 3.

It is possible to adjust the capacitance Cds by adjusting a width W of the field plate 30 between the gate electrode 28 and the drain electrode 26. The width W of the field plate 30 is narrower than a width of the field plate 130 in FIG. 1A. When a distance L2 between the gate electrode 28 and the drain electrode 26 is constant, reducing the width W means increasing a distance L1 between the field plate 30 and the drain electrode 26 in a planar direction of a surface of the nitride semiconductor layer 11.

The width W is, for example, a width of a lower face of the field plate 30 facing the nitride semiconductor layer 11 in a direction from one of the gate electrode 28 and the drain electrode 26 to the other. In other words, the width W is a width of the field plate 30 on a part of the insulating layer 20 between the gate electrode 28 and the drain electrode 26 except for a region of the insulating layer 20 covering a side face of the gate electrode 28. In other words, the width W is a width of a region of the field plate 30 between an edge of the field plate 30 of a side of the drain electrode 26 and an edge of the side face of the insulating layer 20 covering a side face of the gate electrode 28 of a side of the drain electrode 26. The distance L1 is, for example, a distance between an edge of the lower face of the field plate 30 on the side of the drain electrode 26 and an edge of a lower face of the drain electrode 26 on the side of the field plate 30. The lower face is a face in contact with the nitride semiconductor layer 11 (the cap layer 18). The distance L2 between the gate electrode 28 and the drain electrode 26 (gate-drain distance) L2 is, for example, the shortest distance between a contacting face of the gate electrode 28 to the nitride semiconductor layer 11 and a contacting face of the drain electrode 26 to the nitride semiconductor layer 11. Next, a description will be given of a relationship between the width W, the distance L1, the current collapse and the capacitance Cds.

A drain current Id was measured with use of the FET 100 as a sample by fluctuating the width W, in order to measure the current collapse. Voltages between source and drain Vds=0 V and Vds=50 V were used as a reference voltage. Pulse signals having a voltage between gate and source Vgs and a voltage between source and drain Vds were input. And, drain currents Id(50V) and Id(0V) were measured. The value of the current collapse was defined as a ratio between the drain current Id(50V) and the drain current Id(0V) "Id(50V)/Id(0V)" when signals having Vds=5V and Vgs=2V were input. The smaller the current ratio "Id(50V)/Id(0V)" is, the larger the current collapse is. Materials and thicknesses mentioned above and mentioned below were used for the FET 100.

Figure 4A:
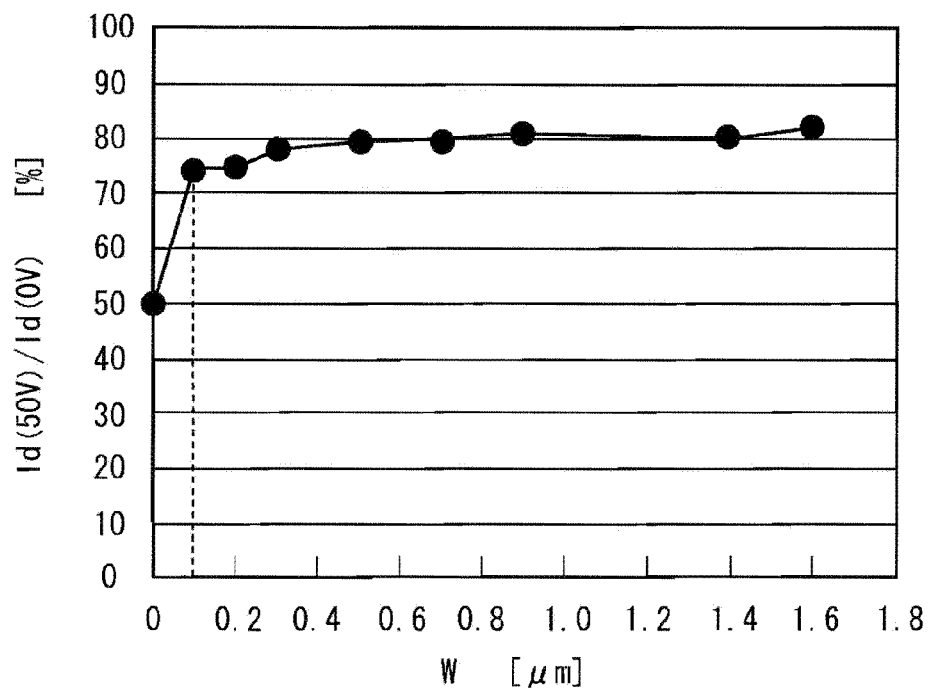
FIG. 4A illustrates a relationship between a width W and current collapse.

Gate length: 0.6 μm
Distance L2 between the gate and the drain: 5.5 μm
Thickness of the insulating layer 20: 450 nm FIG. 4A illustrates a relationship between the width W and the current collapse. A horizontal axis indicates the width W. A vertical axis indicates the current ratio Id(50V)/Id(0V).

As illustrated in FIG. 4A, the narrower the width W of the field plate 30 is, the larger the current collapse is. When the width W is zero, that is, the field plate 30 is not provided, the current ratio is approximately 50%. Therefore, the drain current is greatly reduced by the current collapse. Thus, when the width W is reduced or the field plate 30 is removed, the capacitance Cds is reduced. However, the current collapse is increased.

In contrast, as indicated by a dotted line, when the width W of the field plate 30 is 0.1 μm, the current ratio is approximately 75%. When the width W is 0.2 to 0.3 μm, the current ratio gets closer to 80%. When the width W is 0.4 μm or more, the current ratio is approximately 80%. Therefore, the current collapse is suppressed when the width W is 0.1 μm or more.

Figure 4B:
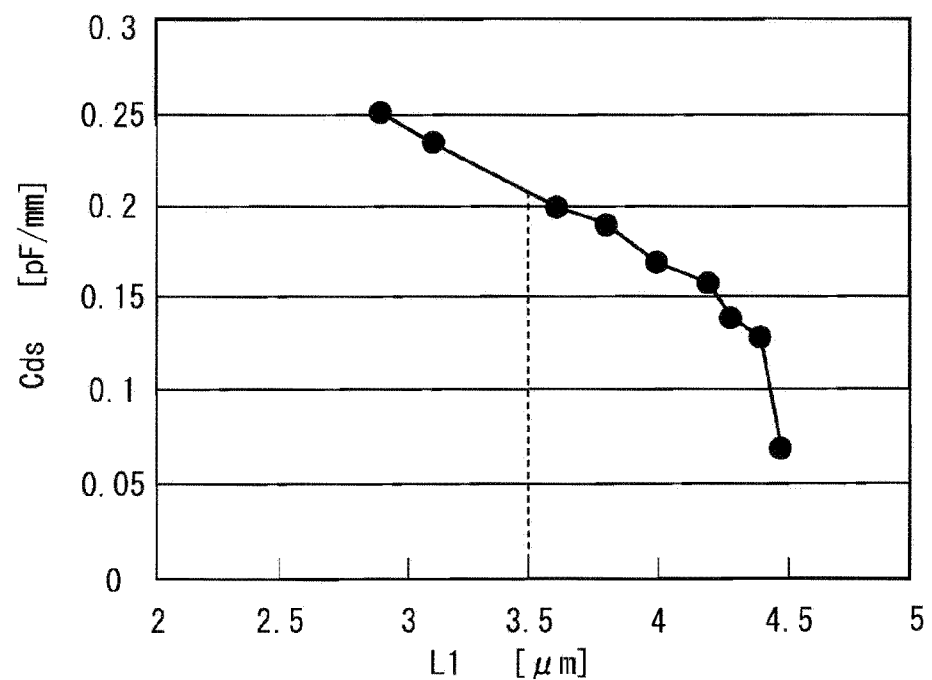
FIG. 4B illustrates a relationship between a distance L1 and a capacitance Cds.

FIG. 4B illustrates a relationship between the distance L1 and the capacitance Cds. A horizontal axis indicates the distance L1. A vertical axis indicates the capacitance Cds. The capacitance Cds was measured by an equivalent circuit analysis. Vds was 50 V, and Vgs was −1.5 V, as a measuring condition.

As illustrated in FIG. 4B, the capacitance Cds gets smaller as the distance L1 gets larger. As indicated by a dotted line, when the distance L1 is 3.5 μm or more, the capacitance Cds is approximately 0.2 pF/mm. When the distance L1 is more than 3.5 μm, the capacitance Cds is approximately 0.2 pF/mm or less. As illustrated in FIG. 2, when the capacitance Cds is 0.2 pF/mm or less, the drain efficiency is 70% or more. That is, when the distance L1 is 3.5 μm or more, the capacitance Cds is 0.2 pF/mm. And the drain efficiency is 70% or more.

The FET 100 in accordance with the first embodiment has the nitride semiconductor layer 11, the source electrode 24, the gate electrode 28, the drain electrode 26, the insulating layer 20 and the field plate 30. The nitride semiconductor layer 11 has the channel layer 14 and the electron supply layer 16. The insulating layer 20 covers the gate electrode 28 and a surface of a part the nitride semiconductor layer 11 between the gate electrode 28 and the drain electrode 26. The width W of the field plate 30 on the part of the insulating layer 20 between the gate electrode 28 and the drain electrode 26 except for the region of the insulating layer 20 covering a side face of the gate electrode 28 is 0.1 μm or more. The distance L1 between the edge of the field plate 30 on the side of the drain electrode 26 and an edge of the drain electrode 26 in a contacting face between the nitride semiconductor layer 11 and the drain electrode 26 on the side of the gate electrode 28 is 3.5 μm or more.

As illustrated in FIG. 4A and FIG. 4B, when the width W of the field plate 30 is 0.1 μm or more and the distance L1 between the field plate 30 and the drain electrode 26 is 3.5 μm or more, the reduction of the capacitance Cds and the suppression of the current collapse are achieved. In other words, the reduction of the source-drain capacitance and the suppression of the current collapse are achieved.

When the width W is excessively small, it may be difficult to make the field plate 30 with high accuracy. Therefore, when the width W is 0.1 μm or more, it is possible to make the field plate 30 with high accuracy, and it is possible to achieve the reduction of the capacitance Cds and the suppression of the current collapse. When the width W is 0.15 μm or more, the current collapse is suppressed effectively. When the width W is 0.2 μm or more, the current collapse is suppressed effectively. When the width W is 0.3 μm or more, the current collapse is suppressed more effectively. When the width W is 0.4 μm or more, the current collapse is suppressed more effectively. As illustrated in FIG. 4A, when the width W is 0.2 μm or more, the effect of the suppression of the current collapse gets larger.

When the distance L1 is 3.7 μm or more, the capacitance Cds is greatly reduced. When the distance L1 is 4 μm or more, the capacitance Cds is greatly reduced. As illustrated in FIG. 4B, when the distance L1 is approximately 4.2 μm or more, the capacitance Cds is 0.15 pF/mm or less. Thus, high efficiency is achieved.

The width W may be larger than 0.1 μm, larger than 0.15 μm, larger than 0.2 μm, larger than 0.3 μm, or larger than 0.4 μm. The distance L1 may be larger than 3.5 μm, larger than 3.7 μm or larger than 4 μm.

The gate-drain distance L2 may be a value so that the width W of 0.1 μm or more establishes the distance L1 of 3.5 μm or more. However, when the distance L2 is large, characteristics may be degraded. And downsizing of the semiconductor device may be difficult. It is therefore preferable that the distance L2 is 7 μm or less. The distance L2 may be 6 μm or less, or 5 μm or less. Thus, degradation of the characteristics of the semiconductor device is restrained, and the downsizing of the semiconductor device gets easier.

The thickness of the insulating layer 20 may be 200 nm to 800 nm, 300 nm to 600 nm, or 400 nm to 500 nm. In particular, when the insulating layer 20 is composed of SiN and the thickness of the insulating layer 20 is 400 nm to 500 nm, the FET 100 may have a structure having characteristics similar to those of FIG. 4A and FIG. 4B. The insulating layer 20 and the insulating layer 22 may be composed of silicon oxide (SiO) or silicon oxynitride (SiON). The substrate 10 may be composed of an insulator such as sapphire or glass epoxy in addition to SiC. The capacitance Cds may fluctuate according to the thickness and the dielectric constant of the insulating layer 20. The insulating layer 20 may have a thickness and be composed of a material so that the capacitance cds is 0.2 pF/mm or less.

Next, a description will be given of a method for manufacturing the FET 100. First, the nitride semiconductor layer 11 is epitaxially grown on the substrate 10 by a MOCVD (Metal Organic Chemical Vapor Deposition) method or the like. A first SiN layer is formed by a plasma CVD (Chemical Vapor Deposition) method or the like. An opening is formed in the first SiN layer by an etching method or the like. The cap layer 18 is exposed through the opening. The remaining first SiN layer is a part of the insulating layer 20.

An ohmic electrode is formed on the cap layer 18 by a vapor deposition method or the like. The ohmic electrode is subjected to an annealing treatment. The ohmic electrode is converted into the source electrode 24 and the drain electrode 26. Another opening is newly formed in the first SiN layer. The gate electrode 28 is formed on a part of the cap layer 18 exposed through the newly formed opening by vapor deposition method or the like. A second SiN layer is formed on the first SiN layer, the source electrode 24, the drain electrode 26 and the gate electrode 28 by a plasma CVD method or the like. The first SiN layer and the second SiN layer act as the insulating layer 20. The order of the formation of the first SiN layer and the formation of the ohmic electrode may be inverted.

The field plate 30 is formed on a part of the insulating layer 20 between the gate electrode 28 and the drain electrode 26 by a vapor deposition method or the like. The insulating layer 22 is formed on the insulating layer 20 by a plasma CVD method or the like. An opening is formed in the insulating layers 20 and 22 so as to expose the source electrode 24 and the drain electrode 26 by an etching method or the like. A wiring (not illustrated) composed of Au is formed so as to couple the source electrode 24 and the drain electrode 26 by a coating method or the like. With the processes, the FET 100 is manufactured.

In FIG. 3, a part of the field plate 30 is above the gate electrode 28. However, the structure is not limited. The field plate 30 may be only between the gate electrode 28 and the drain electrode 26 instead of providing the field plate 30 on the gate electrode 28. It is not necessary for the insulating layer 20 to cover the whole of the cap layer 18. The insulating layer 20 may cover the gate electrode 28, and the surface of the cap layer 18 between the gate electrode 28 and the drain electrode 26.

The nitride semiconductor is a semiconductor including nitrogen (N). The nitride semiconductor may be indium nitride (InN), indium gallium nitride (InGaN), indium aluminum nitride (InAlN), or aluminum indium gallium nitride (AlInGaN) or the like in addition to AlN, GaN and AlGaN.

The present invention is not limited to the specifically disclosed embodiments and variations but may include other embodiments and variations without departing from the scope of the present invention.

What is claimed is:

1. A semiconductor device comprising:
   a substrate;
   a nitride semiconductor layer that is provided on the substrate and includes a channel layer and an electron supply layer;
   a source electrode, a gate electrode and a drain electrode provided on the nitride semiconductor layer;
   an insulating layer that covers at least a side face and a top face of the gate electrode and a surface of a part of the nitride semiconductor layer between the gate electrode and the drain electrode; and
   a field plate that is located between the gate electrode and the drain electrode on the insulating layer,
   a width of a region of the field plate between an edge of the field plate of a side of the drain electrode and an edge of the side face of the insulating layer covering a side face of the gate electrode of a side of the drain electrode being 0.1 μm or more,
   a first distance between an edge of the field plate of the side of the drain electrode and an edge of the drain electrode of the side of the gate electrode in a contact face between the nitride semiconductor layer and the drain electrode being 3.5 μm or more,
   an operating frequency of the semiconductor device being 4 GHz or less.

2. The semiconductor device as claimed in claim 1, wherein a capacitance between the drain electrode and the source electrode is 0.2 pF/mm or less.

3. The semiconductor device as claimed in claim 1, wherein the width of the region of the field plate is 0.2 μm or more.

4. The semiconductor device as claimed in claim 1, wherein a second distance between an edge of the gate electrode in the side of the drain electrode in a face contacting between the nitride semiconductor layer and the gate electrode and the edge of the drain electrode in the side of the gate electrode in the face contacting between the nitride semiconductor layer and the drain electrode is 7 μm or less.

5. The semiconductor device as claimed in claim 1, wherein a thickness of the insulating layer is 400 nm to 500 nm.

6. The semiconductor device as claimed in claim 5, wherein the insulating layer is silicon nitride.

7. The semiconductor device as claimed in claim 1, wherein:
   the channel layer is gallium nitride; and
   the electron supply layer is aluminum gallium nitride.

8. The semiconductor device as claimed in claim 1, wherein the operating frequency of the semiconductor device is 2.6 GHz or more.

9. The semiconductor device as claimed in claim 1, wherein the semiconductor device is used as an amplifier element of an envelope tracking amplifier.

10. The semiconductor device as claimed in claim 6, wherein the insulating layer is composed of a first silicon nitride layer and a second silicon nitride layer.

11. The semiconductor device as claimed in claim 10, wherein the first silicon nitride layer is provided before forming the source electrode, the drain electrode and the gate electrode, and the second silicon nitride layer is provided after forming the source electrode, the drain electrode and the gate electrode.

12. The semiconductor device as claimed in claim 1, wherein the field plate is provided on the side face of the insulating layer covering a side face of the gate electrode of a side of the drain electrode.

13. The semiconductor device as claimed in claim 1, wherein the first distance is 4.2 μm or more.

* * * * *